US012682946B2

(12) United States Patent
Dutta et al.

(10) Patent No.: US 12,682,946 B2
(45) Date of Patent: Jul. 14, 2026

(54) HYBRID BOOSTING FOR MEMORY WRITE ASSIST

(71) Applicant: QUALCOMM Incorporated, San Diego, CA (US)

(72) Inventors: Debarghya Dutta, Kolkata (IN); Ramakoti Nimmakayala, Bangalore (IN); Rahul Sahu, Bangalore (IN); Diwakar Singh, Bangalore (IN)

(73) Assignee: QUALCOMM Incorproated, San Diego, CA (US)

( * ) Notice: Subject to any disclaimer, the term of this patent is extended or adjusted under 35 U.S.C. 154(b) by 228 days.

(21) Appl. No.: 18/428,482

(22) Filed: Jan. 31, 2024

(65) Prior Publication Data

US 2025/0246232 A1 Jul. 31, 2025

(51) Int. Cl.
*G11C 11/419* (2006.01)
(52) U.S. Cl.
CPC .................................. *G11C 11/419* (2013.01)
(58) Field of Classification Search
CPC ....................................................... G11C 7/12
See application file for complete search history.

(56) References Cited

U.S. PATENT DOCUMENTS

| | | | |
|---|---|---|---|
| 2015/0076575 A1 | 3/2015 | Wu et al. | |
| 2015/0206576 A1 | 7/2015 | Gong et al. | |
| 2016/0203857 A1* | 7/2016 | Chandra | G11C 11/412 |
| | | | 365/156 |
| 2016/0240246 A1 | 8/2016 | Sano et al. | |
| 2017/0316820 A1 | 11/2017 | Kumar et al. | |
| 2024/0355365 A1* | 10/2024 | Jungmann | G11C 5/145 |

OTHER PUBLICATIONS

International Search Report and Written Opinion—PCT/US2025/011743—ISA/EPO—May 15, 2025.

* cited by examiner

*Primary Examiner* — Douglas King
(74) *Attorney, Agent, or Firm* — QUALCOMM Incorporated

(57) ABSTRACT

A memory is provided that includes a negative bit line hybrid boost circuit for boosting a discharged bit line to a negative voltage during a negative bit line boost period for a write operation to a selected column in the memory. The hybrid boost circuit uses a charged gate capacitance of a boost transistor and a charged capacitance of a metal line capacitor to provide the negative bit line boost. Similarly, the memory may include a word line hybrid boost circuit that uses another boost transistor and another metal line capacitor for boosting a word line above a word line power supply voltage during the write operation.

11 Claims, 6 Drawing Sheets responding to a first binary state of a boost signal by charging a drain and a source of a boost transistor to a power supply voltage while charging a boost metal line coupled to the drain and source of the boost transistor to the power supply voltage and while grounding a gate of the boost transistor and also while grounding an at least one aggressor metal line coupled to the gate of the boost transistor ~ 500 responding to a second binary state of the boost signal by grounding the drain and source of the boost transistor and grounding the at least one aggressor metal line to boost a bit line coupled to the gate of the boost transistor to a negative voltage ~ 505

FIG. 5

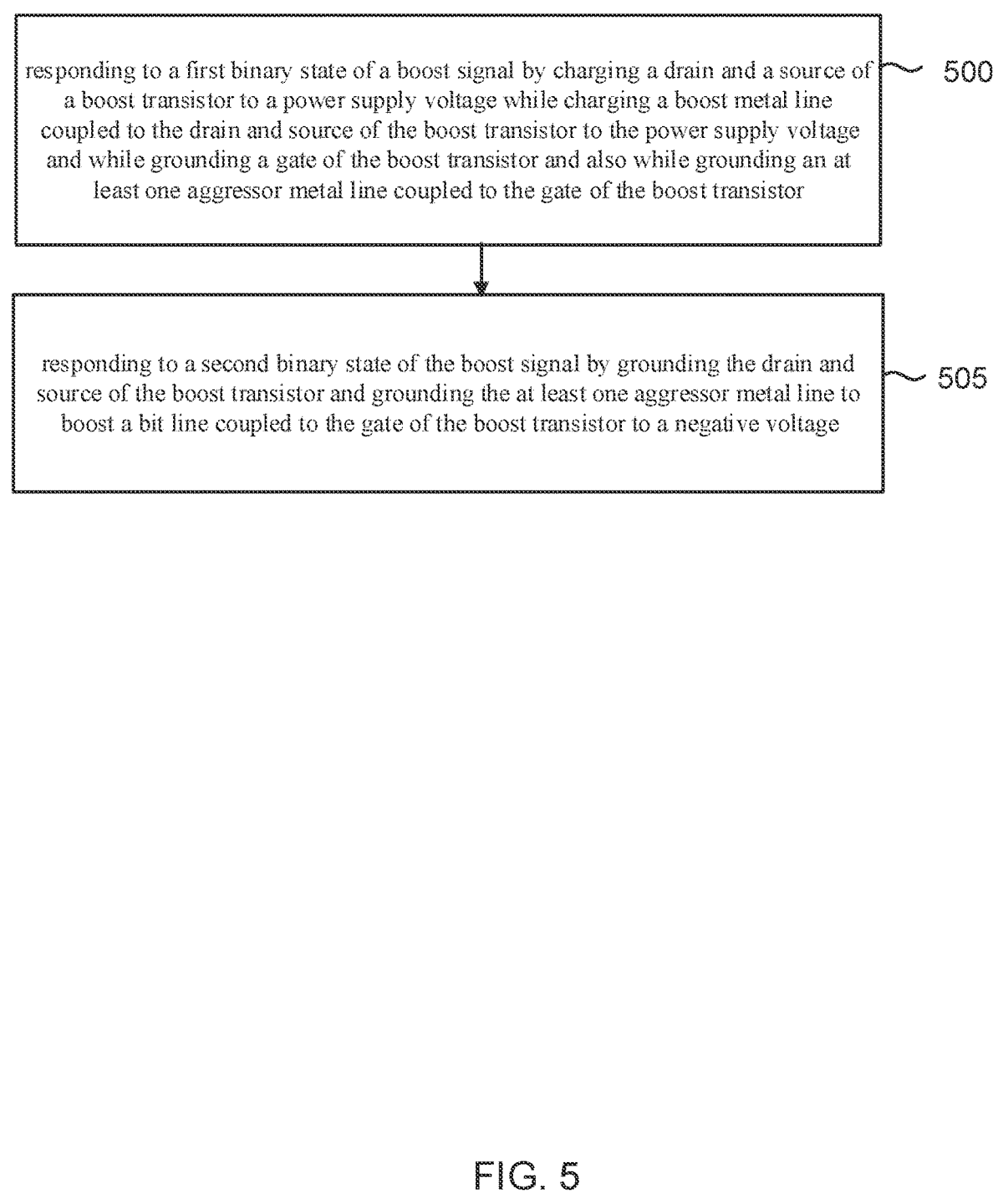

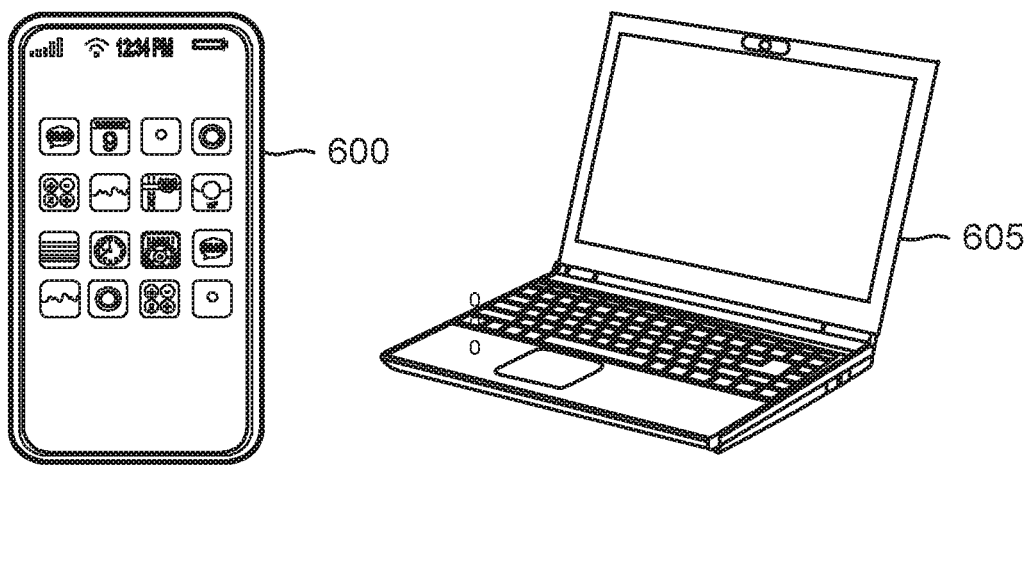
— 600
— 605
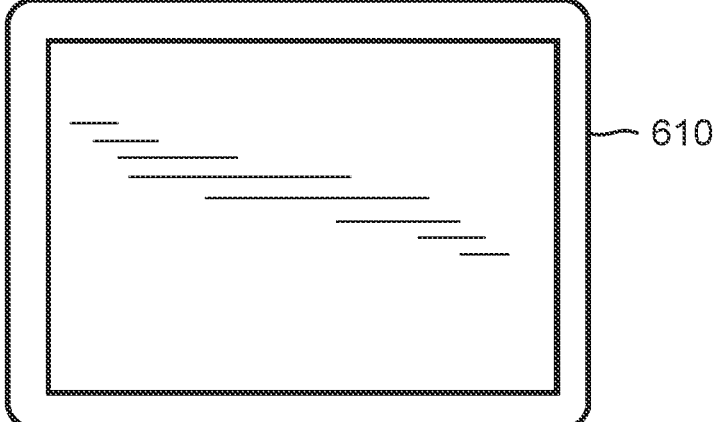
— 610
FIG. 6

HYBRID BOOSTING FOR MEMORY WRITE ASSIST

TECHNICAL FIELD

This application relates to memories, and more particularly to a memories with hybrid boosting for memory write assist.

BACKGROUND

A static random-access memory (SRAM) bitcell includes a pair of cross-coupled inverters. Depending upon the binary state of a stored data bit, a p-type metal-oxide semiconductor (PMOS) transistor in one of the cross-coupled inverters charges a data node to a memory power supply voltage. During a write operation in which the binary content of the bitcell is changed, an n-type metal-oxide semiconductor (NMOS) access transistor is attempting to discharge the same data node while the PMOS transistor continues to charge the data node. The resulting NMOS/PMOS struggle slows the write operation speed and consumes power.

SUMMARY

A memory is disclosed that includes: a bit line; a negative bit line hybrid boost circuit including: a boost transistor; and a metal line capacitor including a first metal line and an at least one second metal line extending adjacent to the first metal line, wherein the first metal line is coupled to the bit line and to a gate of the boost transistor, and wherein the at least one second metal line is coupled to a drain and source of the boost transistor.

In addition, a negative bit line hybrid boost method for a memory is provided that includes the acts of: responding to a first binary state of a boost signal by grounding a gate of a boost transistor while grounding a first metal line coupled to the gate of the boost transistor and while charging a drain and a source of the boost transistor to a power supply voltage while charging an at least one second metal line coupled to the drain and source of the boost transistor to the power supply voltage; and responding to a second binary state of the boost signal by grounding the drain and source of the boost transistor and grounding the at least one second metal line to boost a bit line coupled to the gate of the boost transistor to a negative voltage.

Finally, a memory is provided that includes: a word line; a word line driver configured to charge the word line with a word line power supply voltage during a write operation; a word line hybrid boost circuit including: a boost transistor; and a metal line capacitor, wherein the word line hybrid boost circuit is configured to boost the word line power supply voltage during a word line boost period using a gate capacitance of the boost transistor and a capacitance of the metal line capacitor.

These advantage features may be better appreciated by a consideration of the following detailed description.

BRIEF DESCRIPTION OF THE DRAWINGS

FIG. 5 is a flowchart for a method of negative bit line hybrid boosting in accordance with an aspect of the disclosure.

FIG. 6 illustrates some example electronic systems incorporating a memory with hybrid bit line and/or word line boosting in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
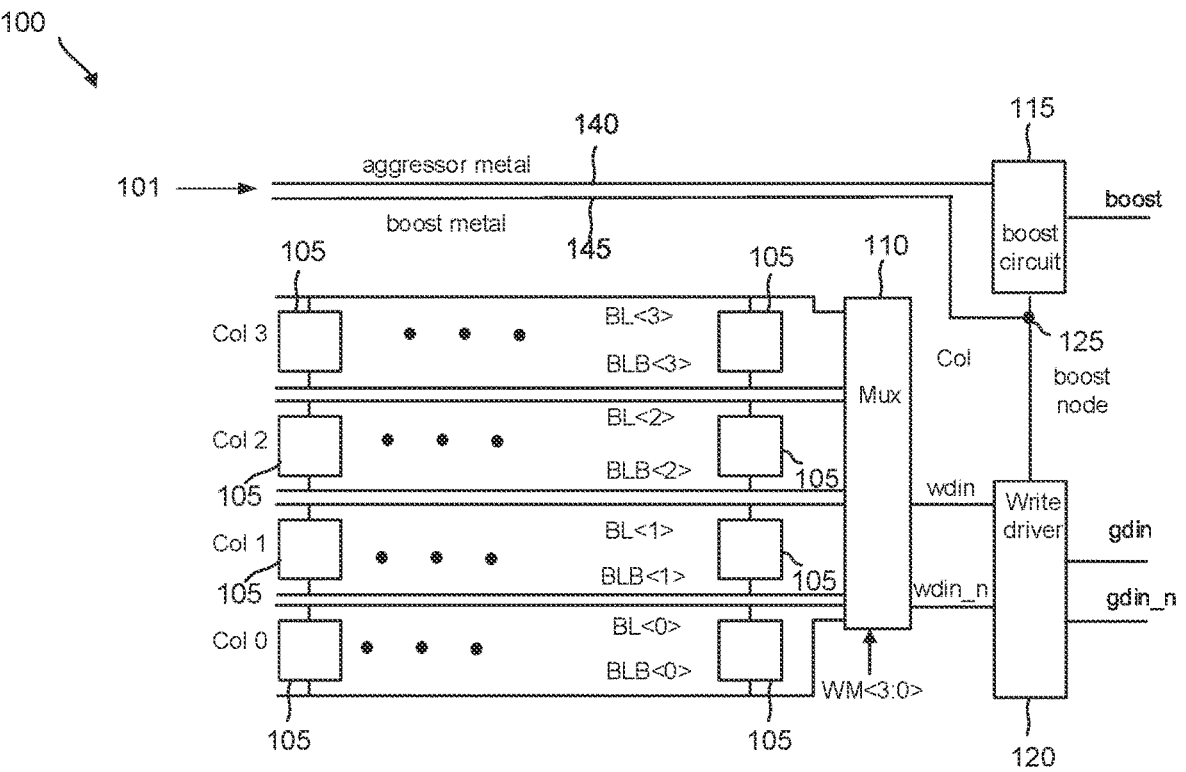
FIG. 1 is a diagram of memory including a negative bit line hybrid boost circuit in accordance with an aspect of the disclosure.

One form of write assist for a static random-access memory (SRAM) is known as a negative bit line boost. With regard to this technique, a write operation may involve changing the binary content of a bitcell such that a data node that is being charged by a PMOS transistor in one of the bitcell's cross-coupled inverters must be discharged during the write operation through an NMOS access transistor to a grounded bit line. In a negative bit line boost operation, the grounded bit line is temporarily boosted to a negative voltage. This negative voltage on the bit line effectively increases the strength of the NMOS access transistor with respect to its struggle with the PMOS transistor that would otherwise continue to charge the data node to a memory power supply voltage. The increased strength of the NMOS access transistor allows it to more quickly discharge the data node so that the write operation speed is increased accordingly. Without the negative bit line boost, the NMOS access transistors may need to be sized larger, which increases the memory footprint on the semiconductor die and thus raises manufacturing costs. But with the negative bit line boost, the NMOS access transistor may be relatively smaller, which decreases the amount of semiconductor die space occupied by the memory and thus lowers manufacturing costs.

To provide the negative boost to the bit line, a write driver may include a negative boost circuit that includes a boost node that is grounded while a boost signal is in a default (e.g., discharged) state. During a write operation, a column multiplexer selects for a column of bitcells traversed by a bit line pair. Depending upon the binary value of the bit being written, the boost node in the boost circuit is coupled to one of the bit lines in the bit line pair in the selected column. The boost circuit includes a boost transistor having its gate coupled to the boost node and having its source and drain coupled to a node controlled by an inverted and buffered version of the boost signal. With the boost signal in its default/discharged state, the drain and source of the boost transistor are charged to the memory power supply voltage whereas its gate is grounded, which charges the gate capacitance of the boost transistor. During a negative bit line boost period, the boost signal is asserted to the memory power supply voltage, which grounds the source and drain of the boost transistor. Since the gate capacitance of the boost transistor has been charged, the grounding of the source and drain of the boost transistor causes the boost transistor gate to be discharged below ground. In this fashion, the boost transistor functions as a boost capacitor to pull the boost node (and thus the corresponding bit line) to a negative voltage during the negative bit line boost period.

This operation of the negative bit line boost circuit is complicated by the need to accommodate various memory sizes. In that regard, a memory is generally sized to its application in that some applications require more storage whereas others require less. With regard to the number of bitcells (and thus the size of the memory), the bitcells are arranged into rows and columns. Each row is traversed by a corresponding word line. Similarly, a corresponding pair of bit lines traverses each column. As the memory size increases, the number of bitcells in a given column will increase. But it is burdensome to custom design a memory for a give application. It is thus common to use a memory compiler that includes a fixed (same size) boost circuit that covers a range of column sizes (e.g., one example range may be from 128 to 255 bitcells per column). The memory compiler generates the memory design depending upon the desired number of bitcells per column but recycles many elements in common such as the boost circuit, which does not change size for a given range of bitcells per column. As the number of bitcells per column increases beyond a given range, the memory compiler changes to a new design for a subsequent column size range. There are thus input/output (IO) break points in the memory compiler. For example, as the number of bitcells per column increases to be greater than 255 bitcells, the memory compiler may transition to a new break point and use a larger fixed size boost circuit. But as long as a break point is not reached for a given column size range, the boost circuit size does not change.

Since the bit line capacitance increases as the number of bitcells per column is increased, one can immediately appreciate that the boost transistor should be sized so as to provide a sufficient boost capacitance at the upper end of the column size range. For example, suppose the number of bitcells per column ranges from 65 bitcells to 128 bitcells. Since the bitcell size is fixed, the column length (and thus the bit line capacitance) is at a maximum at the upper end of the bitcell range. The boost transistor is thus sized to provide a sufficient negative boost at this maximum column size for a give column size range between the corresponding break points of the memory compiler. The size of the boost transistor in a fin field effect (FINFET) transistor implementation may be defined by its number of fins. In such an application, the memory compiler may thus implement the boost transistor using the same number of fins across the entire column size range between break points. But this number of fins is sized so as to provide a sufficient negative boost at the upper end of the column size range.

Although such a boost transistor size will then provide a sufficient negative boost at the upper end of the column size range, note that the bit line capacitance will be at a minimum at the lower end of the column size range. For example, if the column size range is from 65 bitcells to 128 bitcells, the minimum bit line capacitance will be when the column size is just 65 bitcells per each column. There is thus an excess negative boost capacitance at the lower end of the column size range because the boost transistor is sized so as to provide a sufficient negative boost capacitance at the upper end of the column size range. This excessive negative boost capacitance causes power loss due to the resulting excessive negative boosting of the bit line and can also cause a reliability issue due to the excessive negative voltage of the bit line.

One solution to the excessive negative boost issue would be to greatly increase the number of break points in the memory compiler so as to significantly reduce the column size range. But this would significantly increase the memory compiler complexity and cost. A hybrid solution is disclosed herein in which the memory compiler may retain a traditional set of break points but without excess negative boost at the lower end of each column size range. As implied by the "hybrid" designation, the negative boost is not merely provided by a traditional boost circuit capacitor formed by a boost transistor but also by a metal line capacitor. With regard to the metal line capacitor, note that the memory's active devices such as transistors are integrated into a semiconductor substrate. Adjacent to the semiconductor substrate are a plurality of metal layers separated by insulating dielectric layers. The metal layers are patterned such as through photolithography into leads for a variety of signals, power, and ground. For example, a metal layer (or more than one metal layer) may be patterned to form the bit lines. At the lower end of a column size range between the compiler break points, the bit lines are relatively short but grow longer to a maximum length at the upper end of the column size range. For example, should the column size range from 65 bitcells to 128 bitcells, the bit lines would be shortest for the 65 bitcell column size whereas the bit lines would be longest for the 128 bitcell column size. Advantageously, the metal line capacitor is formed by metal layer lines that are substantially as long as the bit lines or have a length that is proportional to the bit line length. The capacitance of the metal line capacitor will thus scale with the column size such that the capacitance is smallest for the smallest column size and greatest for the greatest column size. There is thus adequate negative bit line boost for the largest column size without incurring excessive negative bit line boost for the smallest column size. Due to the benefits of the metal line capacitor, the boost transistor size may be reduced to conserve semiconductor die space and to reduce power consumption.

An example memory 100 is shown in FIG. 1. For illustration clarity, only a single input/output (IO) group of columns of bitcells 105 is shown in FIG. 1. A write driver 120 receives a data input signal gdin to drive a write driver input signal (wdin) accordingly. Similarly, write driver 120 receives a complement data input signal gdin_n to drive a complement write driver input signal (wdin_n) accordingly. A column multiplexer 110 selects for a column of bitcells 105 during a write operation to couple the write driver input signal to a bit line in the selected column. Similarly, the column multiplexer 110 couples the complement write driver input signal to a complement bit line in the selected column. The number of columns multiplexed by the column multiplexer 110 (and thus the number of columns in a single IO group) depends upon the memory implementation. In memory 100, column multiplexer 110 selects from four columns of bitcells 105 ranging from a zeroth column (Col 0) to a third column (Col 3) but it will be appreciated that a different IO size may be used in alternative implementations such as two columns or eight columns.

The column multiplexer 110 responds to a column address signal WM<3:0> to select the appropriate column. Each column of bitcells 105 is traversed by a pair of bit lines. For example, a bit line BL<0> and a complement bit line BLB<0> both traverse the length of the zeroth column. Similarly, a bit line BL<1> and a complement bit line BLB<1> traverse the length of a first column whereas a bit line BL<2> and a complement bit line BLB<2> traverse the length of a second column. Finally, a bit line BL<3> and a complement bit line BLB<3> traverse the length of a third column. During a write operation, the column multiplexer 110 couples the write driver input signal to the bit line in the selected column. Similarly, the column multiplexer 110 couples the complement write driver input signal to the complement bit line in the selected column. The bitcells 105 are also arranged into rows but for illustration clarity only a first row of bitcells 105 and a final row of bitcells 105 are shown in FIG. 1.

Depending upon the binary value of the input data signal gdin, either the write driver input signal or the complement write driver input signal is grounded during the write operation. As will be explained further herein, a negative bit line hybrid boost circuit 115 functions during a negative bit line boost period to provide a negative voltage to a boost node 125. The boost node 125 couples through the write driver 120 to the grounded one of the write driver input signals. For example, if the complement write driver input signal is grounded during the write operation, the negative boost applied to the boost node 125 will also provide a negative boost to the complement write driver input signal. In turn, this negative boost then couples through the column multiplexer 110 to the complement bit line in the selected column. Should instead it be the write driver input signal that is grounded during the write operation, then it would be the bit line in the selected column that receives the negative bit line boost.

To provide the negative boost to the boost node 125, the negative bit line hybrid boost circuit 115 includes a boost transistor (not illustrated in FIG. 1 but discussed further herein) that functions as a boost capacitor. With nothing more, such a boost capacitor would need to be sized so as to provide a sufficient negative boost to the largest expected column size. But as discussed previously, such a robust boost capacitor size then provides an excessive negative boost to the smallest expected column size, which consumes power and may also cause reliability problems. But the boost transistor in the negative bit line hybrid boost circuit 115 may be sized so as to not even provide a sufficient capacitance for the smallest expected column size because the memory 100 also includes a metal line capacitor 101 formed by a boost metal line 145 and at least one aggressor metal line 140. The boost metal line 145 is also denoted herein as a first metal line. Similarly, the at least one aggressor metal line is also denoted herein as an at least one second metal line. The boost metal line 145 and the aggressor metal line 140 are patterned from the same metal layer and are sufficiently adjacent to each other to provide the desired amount of boost capacitance. The boost metal line 145 couples to the boost node 125 and is thus boosted to the negative voltage during the negative bit line boost period. Moreover, the aggressor metal line 140 and the boost metal line 145 may have a length that is substantially similar to the bit line length (or is proportional to the bit line length). In this fashion, the capacitance of the metal line capacitor 101 scales with the bit line length so that the resulting hybrid negative bit line boost is adequate and not excessive across the entire expected column size.

Figure 2:
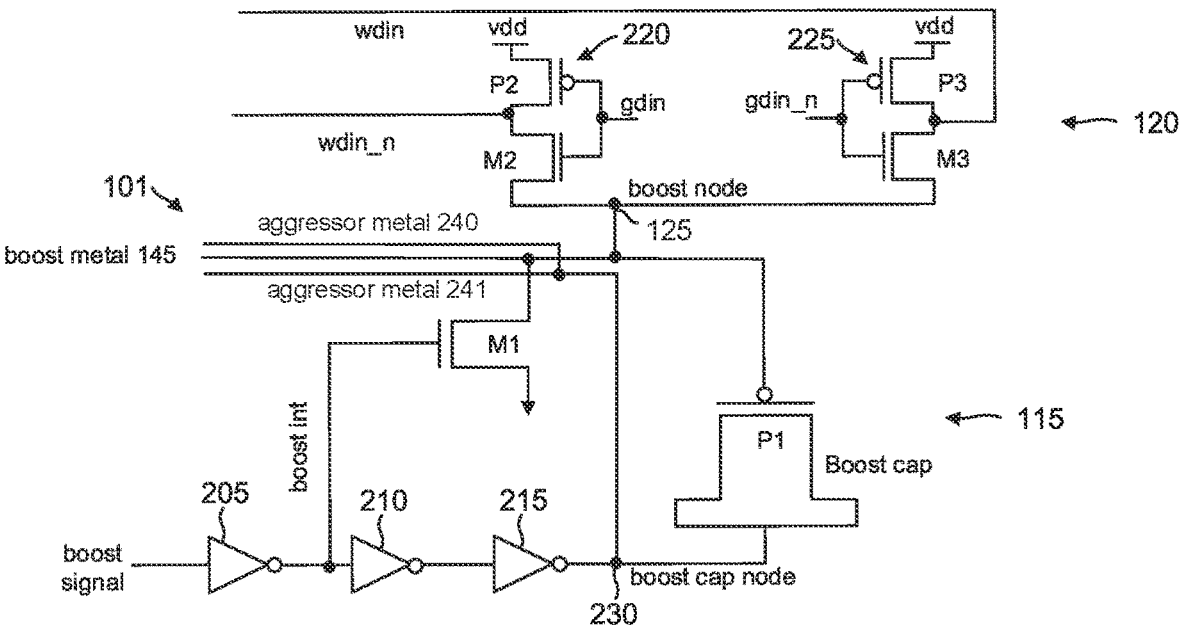
FIG. 2 is a circuit diagram of the negative bit line hybrid boost circuit and of the write driver of FIG. 1 in accordance with an aspect of the disclosure.

The write driver 120 and the negative bit line hybrid boost circuit 115 are shown in more detail in FIG. 2. As noted earlier, a boost signal to the negative bit line hybrid boost circuit 115 has a default grounded state although a default charged state may be used in alternative implementations. An inverter 205 inverts the boost signal to form an inverted boost signal (boost int) that drives a gate of an n-type metal-oxide semiconductor (NMOS) transistor M1 having its source coupled to ground and a drain coupled to the boost node 125. Transistor M1 is also denoted as a first transistor herein. Similarly, inverter 205 may also be denoted as a first inverter herein.

Because of the inversion of the discharged boost signal, the inverted boost signal is then asserted to the memory power supply voltage, which switches on transistor M1 to ground the boost node 125. A serial pair of inverters 210 and 215 forms a buffered version of the inverted boost signal to drive a boost capacitor node 230 formed by a drain and source of a p-type metal-oxide semiconductor (PMOS) transistor P1 having a gate coupled to the boost node 125. Transistor P1 is also denoted as a boost transistor herein. Similarly, inverters 210 and 215 are also denoted respectively as second and third inverters. A gate capacitance of the transistor P1 thus functions as a boost capacitor (boost cap). While the boost signal is in its default discharged state, the drain and source of the transistor P1 are charged to the memory power supply voltage whereas the gate of the transistor P1 is grounded.

During the negative bit line boost period, a memory controller (not illustrated) asserts the boost signal to the memory power supply voltage. The inverted boost signal is thus grounded during the negative bit line boost period to switch off transistor M1. The boost capacitor node 230 (the drain and source of transistor P1) is also grounded during the negative bit line boost period due to the grounding of the inverted boost signal. This discharge of the source/drain of transistor P1 causes its gate (and thus the boost node 125) to be pulled to a negative voltage due to the previously charged state of the gate capacitance of transistor P1. Note that transistor P1 may be undersized with respect to providing a sufficient negative bit line boost. For example, in a traditional (non-hybrid) FINFET implementation of the boost capacitor for a column size range of 65 bitcells to 128 bitcells, 216 fins may be used to form transistor P1. But in the negative bit line hybrid boost circuit 115, the transistor P1 may be formed using just 52 fins for the same column size range. Since each IO group of columns is associated with a corresponding boost circuit/boost capacitor combination, it may be appreciated that the resulting use of an undersized transistor P1 in the negative bit line hybrid boost circuit 115 advantageously reduces the footprint (semiconductor die area) occupied by memory 100.

Transistor P1 may be undersized because the boost node 125 also couples to the boost metal line 145 whereas the aggressor metal line couples to the boost cap node 230. The resulting boost capacitance is a hybrid boost capacitance since it is not only provided by transistor P1 but also by the metal line capacitor 101. In one implementation, the aggressor metal line may be formed by a first aggressor metal line 240 and a second aggressor metal line 241. The first aggressor metal line 240 is also denoted herein as a third metal line. Similarly, the second aggressor metal line 241 is also denoted herein as a fourth metal line. Both the first and second aggressor metal lines 240 and 241 may be formed in the same metal layer used to construct the boost metal line 145. The first aggressor metal line 240 is adjacent a first side of the boost metal line 145 whereas the second aggressor metal line 241 is adjacent a second side of the boost metal line 145. Due to the coupling of the boost metal line 145 to the boost node 125 and coupling of the first and second aggressor metal lines 240 and 241 to the boost capacitor node 230, the metal line capacitor 101 functions analogously to the boost capacitor formed by transistor P1 with respect to providing the negative boost to the boost node 125. In particular, the boost metal line 145 is grounded whereas the first and second aggressor metal lines 240 and 241 are charged to the memory power supply voltage while the boost signal is in its default grounded state. When the boost signal is asserted to the memory power supply voltage during the negative boost period, the first and second aggressor metal lines 240 and 241 are grounded to cause the charged capacitance of the metal line capacitor 101 to help pull the boost node 125 to the desired negative voltage. Moreover, whereas the size of transistor P1 is fixed for a given column size range, the length of the metal line capacitor 101 is proportional to (or equal to) the bit line length. Thus, the boost capacitance from the metal line capacitor 101 scales with the bit line length.

The write driver 120 may be implemented using an inverter 220 formed by a PMOS transistor P2 and an NMOS transistor M2 and an inverter 225 formed by a PMOS transistor P3 and an NMOS transistor M3. The sources of transistors M2 and M3 couple to the boost node 125. Similarly, the sources of transistors P2 and P3 couple to a node for the memory power supply voltage (vdd). A metal lead for the complement write driver input signal (wdin_n) couples to the drains of transistor P2 and M2. The data input signal (gdin) drives the gates of transistors P2 and M2. Should the data input signal be asserted, transistor M2 switches on so that the complement write driver input signal is grounded while the boost signal is in its default state. The complement write driver input signal is then pulled to the negative boost voltage during the negative bit line boost period (with the data input signal being asserted). Referring again to FIG. 1, the complement write driver input signal couples through the column multiplexer 110 to the complement bit line in the selected column. The complement bit line in the selected column is then pulled to a negative boost voltage during the negative bit line boost period (with the data input signal being asserted).

A metal lead for the write driver input signal (wdin) couples to the drains of transistor P3 and M3. The complement data input signal (gdin_n) drives the gates of transistors P3 and M3. Should the complement data input signal be asserted, transistor M3 switches on so that the write driver input signal is grounded while the boost signal is in its default state. The write driver input signal would then be pulled to the negative boost voltage during the negative bit line boost period (with the complement data input signal being asserted). Referring again to FIG. 1, the write driver input signal couples through the column multiplexer 110 to the bit line in the selected column. The bit line in the selected column is thus pulled to a negative boost voltage during the negative bit line boost period (with the complement data input signal being asserted).

If the capacitance of transistor P1 is represented as C1 and the capacitance of the metal line boost capacitor extending across the length of one bitcell 105 is designated as C2, the total boost capacitance equals a sum of C1 and N*C2, where N is the column size in bitcells. It may thus readily be appreciated that the total boost capacitance will scale with the column length.

The hybrid negative bit line boost disclosed herein may be combined with a hybrid word line boost. In that regard, recall that the bitcells 105 in memory 100 are arranged into rows. A corresponding word line traverses each row to couple to a pair of NMOS access transistors (not illustrated) in each bitcell in the row. When the word line voltage is asserted to the memory power supply voltage, the NMOS access transistors are switched on so that the write operation may change (if necessary) the binary contents of the accessed bitcells 105. To assist the resulting NMOS/PMOS struggle that may occur if the binary contents of an accessed bitcell 105 are reversed, a traditional word line boost circuit includes a boost transistor that function as a word line boost capacitor to boost the word line voltage above the memory power supply voltage. However, a memory compiler typically uses a fixed boost transistor size for word line boost for a given row size range as measured in bitcells. The boost transistor is then sized so as to provide adequate word line boost at the upper end of the row size range. There may then be excessive word line boost for the lower end of the row size range, which increases power consumption and raises reliability issues. With regard to the row size, it may scale according to the same break points as used for the column size. For example, in one implementation, a break point may begin a row size range at 65 bitcells and extend to 128 bitcells. From the break point at 128 bitcells, another row size range may begin at 129 bitcells and extend to 256 bitcells, and so on.

A word line hybrid boost circuit is disclosed that functions analogously as discussed for the negative bit line hybrid boost circuit 115 in that it includes a boost transistor functioning as a boost capacitor and also includes a metal line capacitor having a length proportional to (or the same size as) the word line length. The metal line capacitor will thus scale according to the row size so that the resulting word line hybrid boost is adequate and not excessive across the entire expected row size.

Figure 3:
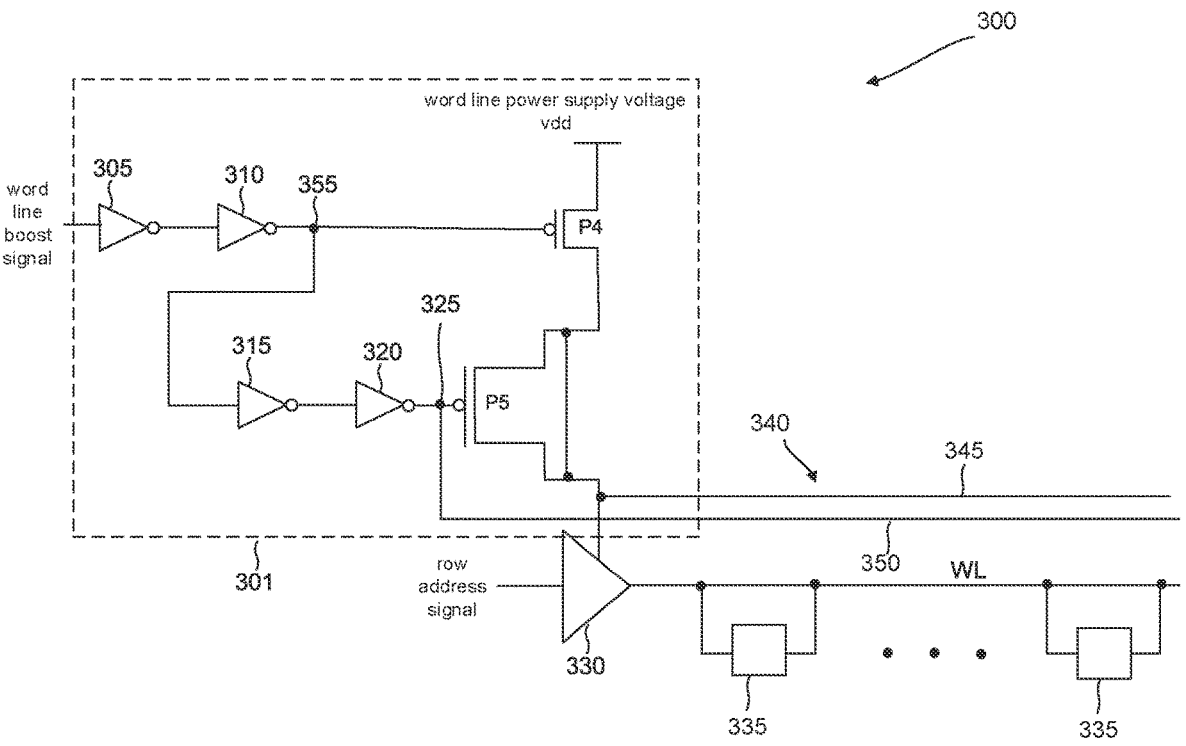
FIG. 3 is a diagram of a memory including a word line hybrid boost circuit in accordance with an aspect of the disclosure.

An example memory 300 with a word line hybrid boost circuit 301 is shown in FIG. 3. A serial pair of inverters 305 and 310 buffers a word line boost signal to form a buffered word line boost signal at a node 355 that couples to a gate of a PMOS transistor P4. The word line boost signal is grounded in its default state (although this may be reversed in alternative implementations), which switches on transistor P4. A source of transistor P4 couples to a node for a word line power supply voltage (vdd). The drain of transistor P4 couples to a power supply input node for a word line driver 330. The word line driver 330 responds to a row address signal by charging a word line (WL) to the word line power supply voltage during a write operation. The word line couples to the access transistors (not illustrated) in a row of bitcells 335. For illustration clarity, only a single row of bitcells 335 and a corresponding word line driver 330 and word line hybrid boost circuit 301 are shown for memory 300. But as discussed for memory 100, memory 300 may include multiple rows of bitcells 335, each having its own word line driver 330 and word line hybrid boost circuit 301.

With the word line asserted to the word line power supply voltage, the access transistors switch on in the selected row so that the write operation may write to the bitcells 335. To assist the write operation, the word line boost signal is charged to the word line power supply voltage during a word line boost period, which switches off transistor P4. The drain of transistor P4 couples to the drain and source of a PMOS transistor P5 that functions as a word line boost capacitor. Node 355 couples through a serial pair of inverters 315 and 320 to a node 325 at the gate of transistor P5. With the word line boost signal in its default state, the gate of transistor P5 is thus grounded whereas the source and drain of transistor P5 are charged to the word line power supply voltage. The gate capacitance of transistor P5 is thus charged to the word line power supply voltage. The word line boost signal is then charged to the word line power supply voltage during the word line boost period, which may be substantially simultaneous with the negative bit line boost period. With the word line boost signal asserted, transistor P4 switches off after the propagation delay through inverters 305 and 310. After an additional propagation delay through inverters 315 and 320, the gate voltage of transistor P5 is charged to the word line power supply voltage, which causes the word line to be boosted above the word line power supply voltage.

Since the size of transistor P5 is fixed for a given compiler row size, the bit line hybrid boost circuit also uses a metal line capacitor 340 formed by a boost metal line 345 and an at least one aggressor metal line 350. Analogous to the word line, the boost metal line 345 and the aggressor metal line 350 may be formed in a metal layer such as through photolithography. The boost metal line 345 couples to the source and drain of transistor P5 and is thus tied to the word line voltage. The aggressor metal line 350 couples to the node 325 and is thus tied to the gate voltage of transistor P5. With the word line boost signal in its default state (discharged), the boost metal line 345 is charged to the word line power supply voltage whereas the aggressor metal line 350 is grounded. Following the propagation delay through inverters 305, 310, 315, and 320 after the word line boost signal is asserted to the word line power supply voltage, the charged capacitance of the metal line capacitor 340 causes the boost metal line 345 (and thus the word line voltage) to be boosted above the word line power supply voltage. This boosting is in conjunction with the boosting from the gate capacitance of transistor P5.

The metal line capacitor 340 extends across the length of the word line to have substantially the same length as the word line or to have a length that is proportional to the word line length (the word line length may also be denoted as a width since the word line direction is orthogonal to the bit line direction). The capacitance of the metal line capacitor 340 scales with the word line size. The word line boost from the metal line capacitor 340 will thus not be excessive at the lower end of the word line size range nor will the word line boost be inadequate to the higher end of the word line size range. In contrast to the metal line capacitor 340, the size of transistor P5 is fixed across the word line size range. It will be appreciated that the negative bit line hybrid boosting discussed with respect to memory 100 may be combined with the word line hybrid boosting discussed with regard to memory 300. In other implementations, just the negative bit line boosting or just the word line hybrid boosting may be used in a given memory. In that regard, memory 100 and memory 300 may represent the same memory or they may be distinct memories.

Figure 4:
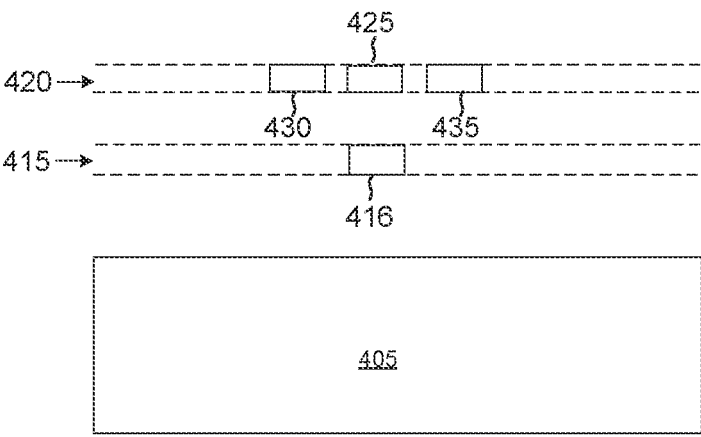
FIG. 4 is a cross-sectional view of a semiconductor device including a metal line capacitor for a hybrid boost of either a bit line or a word line in accordance with an aspect of the disclosure.

The metal line capacitors disclosed herein will now be discussed with respect to the cross-sectional view of FIG. 4. The active devices such as PMOS and NMOS transistors for a memory 400 are integrated into a semiconductor substrate 405. Above the semiconductor substrate 405 is a first metal layer 410 that has been etched away except for a metal lead 416 that may be either a bit line or a word line. Although the first metal layer 410 is shown as the metal layer that is closest to the substrate 405, it will be appreciated that the bit line or word lines disclosed herein may be formed in any suitable metal layer. Furthermore, it should be appreciated that there may be one or more other layers (e.g., middle end of line layers) between the substrate 405 and the metal layer 410 (though not illustrated in FIG. 4 to avoid obscuring the drawing). A second metal layer 420 is also etched away except for a boost metal line 425, a first aggressor metal line 430, and a second aggressor metal line 435. The first aggressor metal line 430 is adjacent a first side of the boost metal line 425 whereas the second aggressor metal line 435 is adjacent a second side of the boost metal line 425. The combination of the boost metal line 425, the first aggressor metal line 430, and the second aggressor metal line 435 forms a metal line capacitor such as for a negative bit line hybrid boosting or a word line hybrid boosting. Although the second metal layer 420 is distinct from the first metal layer 415, it will be appreciated that the same metal layer may be used to form a bit line (or a word line) and a corresponding metal line capacitor in alternative implementations. Insulating dielectric layers separate the first metal layer 415 from the substrate 405 and from the second metal layer 420. Note that metal layers 415 and 420 may be separated from each other by additional metal layers (not illustrated) and corresponding insulating dielectric layers.

A flowchart for a method of negative bit line hybrid boosting is shown in FIG. 5. The method includes an act 500 of responding to a first binary state of a boost signal by grounding a gate of a boost transistor while grounding a first metal line coupled to the gate of the boost transistor and while charging a drain and a source of the boost transistor to a power supply voltage while charging an at least one second metal line coupled to the drain and source of the boost transistor to the power supply voltage. An example of act 500 is the response of the negative bit line hybrid boost circuit 115 to the grounding of the boost signal by a charging of the boost cap node 230 to the memory power supply and thus a charging of the drain and source of transistor P1 and of the aggressor metal lines 240 and 241. Similarly, the same example of act 500 also includes the simultaneous response of the negative bit line hybrid boost circuit 115 to the grounding of the boost signal by a grounding of the gate of transistor P1 and of the boost metal line 145.

The method also includes an act 505 of responding to a second binary state of the negative bit line boost signal by grounding the drain and source of the boost transistor and grounding the at least one second metal line to boost a bit line coupled to the gate of the boost transistor to a negative voltage. An example of act 505 is the response of the negative bit line hybrid boost circuit 115 to the charging of the boost signal by grounding the boost cap node 230 and thus grounding the source and drain of transistor P1 and also grounding the aggressor metal lines 240 and 241 to pull the bit line voltage below ground.

A memory with a negative bit line hybrid boost and/or a word line hybrid boost as disclosed herein may be incorporated into a wide variety of electronic systems. For example, as shown in FIG. 6, a cell phone 600, a laptop 605, and a tablet PC 610 may all include a memory configured for a hybrid bit line and/or word line boosting. Other exemplary electronic systems such as a music player, a video player, a communication device, and a personal computer may also be configured with memories constructed in accordance with the disclosure.

The disclosure will now be summarized in the following example clauses:

Clause 1. A memory comprising:
    a bit line;
    a negative bit line hybrid boost circuit including:
    a boost transistor; and
    a metal line capacitor including a first metal line and an
        at least one second metal line extending adjacent to the
        first metal line, wherein the first metal line is coupled
        to the bit line and to a gate of the boost transistor, and
        wherein the at least one second metal line is coupled to
        a drain and source of the boost transistor.

Clause 2. The memory of clause 1, wherein a length of the metal line capacitor is proportional to a length of the bit line.

Clause 3. The memory of clause 2, wherein the length of the metal line capacitor is substantially equal to the length of the bit line.

Clause 4. The memory of any of clauses 1-3, wherein the bit line is within a first metal layer neighboring a semiconductor substrate, and wherein the first metal line and the at least one second metal line is within a second metal layer neighboring the first metal layer.

Clause 5. The memory of clause 4, wherein the at least one second metal line comprises a third metal line extending adjacent a first side of the first metal line and comprises a fourth metal line extending adjacent a second side of the first metal line.

Clause 6. The memory of any of clauses 1-5, wherein the negative bit line hybrid boost circuit further includes:

a first transistor having a drain coupled to the first metal line and having a source coupled to ground; and a first inverter configured to invert a boost signal and having an output terminal coupled to a gate of the first transistor.

Clause 7. The memory of clause 6, wherein the negative bit line hybrid boost circuit further includes:

a second inverter in series with the first inverter; and a third inverter in series with the second inverter and having an output terminal coupled to the at least one second metal line and to the source and the drain of the boost transistor.

Clause 8. The memory of clause 7, wherein the boost transistor comprises a p-type metal-oxide semiconductor (PMOS) transistor.

Clause 9. The memory of any of clauses 1-8, further comprising:

a write driver; and a column multiplexer, wherein the bit line is configured to couple through the column multiplexer and the write driver to the negative bit line hybrid boost circuit.

Clause 10. The memory of any of clauses 1-9, wherein the memory is a static random-access memory (SRAM).

Clause 11. The memory of any of clauses 1-10, further comprising:

an array of bitcells arranged into columns and rows, wherein the bit line is configured to extend across one of the columns.

Clause 12. The memory of any of clauses 1-11, wherein the memory is incorporated into a cellular telephone.

Clause 13. A negative bit line hybrid boost method, comprising:

responding to a first binary state of a boost signal by grounding a gate of a boost transistor while grounding a first metal line coupled to the gate of the boost transistor and while charging a drain and a source of the boost transistor to a power supply voltage while charging an at least one second metal line coupled to the drain and source of the boost transistor to the power supply voltage; and responding to a second binary state of the boost signal by grounding the drain and source of the boost transistor and grounding the at least one second metal line to boost a bit line coupled to the gate of the boost transistor to a negative voltage.

Clause 14. The method of clause 13, wherein responding to the first binary state of the boost signal comprises responding to a grounding of the boost signal and wherein responding to the second binary state of the boost signal comprises responding to a charging of the boost signal to the power supply voltage.

Clause 15. The method of clause 14, wherein responding to the grounding of the boost signal comprises:

inverting the boost signal to form an inverted boost signal at a gate of a first transistor coupled between the gate of the boost transistor and ground and also coupled between the first metal line and ground to switch on the first transistor to ground the gate of the boost transistor and also to ground the first metal line; and buffering the inverted boost signal to form a buffered inverted boost signal that is charged to the power supply voltage to charge the drain and the source of the boost transistor to and to charge the at least one second metal line to the power supply voltage.

Clause 16. The method of clause 15, wherein responding to the charging of the boost signal comprises:

switching off the first transistor.

Clause 17. A memory, comprising:

a word line;

a word line driver configured to charge the word line with a word line power supply voltage during a write operation;

a word line hybrid boost circuit including:

a boost transistor; and a metal line capacitor, wherein the word line hybrid boost circuit is configured to boost the word line power supply voltage during a word line boost period using a gate capacitance of the boost transistor and a capacitance of the metal line capacitor.

Clause 18. The memory of clause 17, further comprising:

an array of bitcells arranged into rows and columns, wherein the word line is configured to extend across a row, wherein the metal line capacitor includes a first metal line and an at least one second metal line each having a length that is proportional to a length of the word line.

Clause 19. The memory of clause 18, wherein the length of the first metal line and length of the at least one second metal line are both substantially equal to the length of the word line.

Clause 20. The memory of clause 18, wherein first boost metal line is coupled to a drain and a source of the boost transistor and to the word line, and wherein the at least one second metal line is coupled to a gate of the boost transistor.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A memory comprising:

a bit line;

a negative bit line hybrid boost circuit including:

a boost transistor; and a metal line capacitor including a first metal line and an at least one second metal line extending adjacent to the first metal line, wherein the first metal line is coupled to the bit line and to a gate of the boost transistor, and wherein the at least one second metal line is coupled to a drain and source of the boost transistor, wherein the bit line is within a first metal layer neighboring a semiconductor substrate, and wherein the first metal line and the at least one second metal line is within a second metal layer neighboring the first metal layer.

2. The memory of claim 1, wherein a length of the metal line capacitor is proportional to a length of the bit line.

3. The memory of claim 2, wherein the length of the metal line capacitor is substantially equal to the length of the bit line.

4. The memory of claim 1, wherein the negative bit line hybrid boost circuit further includes:

a first transistor having a drain coupled to the first metal line and having a source coupled to ground; and a first inverter configured to invert a boost signal and having an output terminal coupled to a gate of the first transistor.

5. A memory comprising:

a bit line;

a negative bit line hybrid boost circuit including:

a boost transistor;

a metal line capacitor including a first metal line and an at least one second metal line extending adjacent to the first metal line, wherein the first metal line is coupled to the bit line and to a gate of the boost transistor, and wherein the at least one second metal line is coupled to a drain and source of the boost transistor;

a first transistor having a drain coupled to the first metal line and having a source coupled to ground;

a first inverter configured to invert a boost signal and having an output terminal coupled to a gate of the first transistor;

a second inverter in series with the first inverter; and a third inverter in series with the second inverter and having an output terminal coupled to the at least one second metal line and to the source and the drain of the boost transistor.

6. The memory of claim 5, wherein the boost transistor comprises a p-type metal-oxide semiconductor (PMOS) transistor.

7. The memory of claim 1, further comprising:

a write driver; and a column multiplexer, wherein the bit line is configured to couple through the column multiplexer and the write driver to the negative bit line hybrid boost circuit.

8. The memory of claim 1, wherein the memory is a static random-access memory (SRAM).

9. The memory of claim 1, further comprising:

an array of bitcells arranged into columns and rows, wherein the bit line is configured to extend across one of the columns.

10. The memory of claim 1, wherein the memory is incorporated into a cellular telephone.

11. The memory of claim 1, wherein the at least one second metal line comprises a third metal line extending adjacent a first side of the first metal line and comprises a fourth metal line extending adjacent a second side of the first metal line.

* * * * *